(12) United States Patent
Gai et al.

(10) Patent No.: US 10,355,056 B2
(45) Date of Patent: Jul. 16, 2019

(54) OLED DEVICE AND MANUFACTURING METHOD THEREOF, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Renrong Gai, Beijing (CN); Weilin Lai, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/564,084

(22) PCT Filed: May 4, 2017

(86) PCT No.: PCT/CN2017/083045
§ 371 (c)(1),
(2) Date: Oct. 3, 2017

(87) PCT Pub. No.: WO2017/211148
PCT Pub. Date: Dec. 14, 2017

(65) Prior Publication Data
US 2018/0197920 A1    Jul. 12, 2018

(30) Foreign Application Priority Data

Jun. 8, 2016 (CN) .......................... 2016 1 0402307

(51) Int. Cl.
*H01L 51/52* (2006.01)
*H01L 27/32* (2006.01)
*H01L 51/56* (2006.01)

(52) U.S. Cl.
CPC ........ *H01L 27/322* (2013.01); *H01L 51/5256* (2013.01); *H01L 51/5281* (2013.01); *H01L 51/5284* (2013.01); *H01L 51/56* (2013.01)

(58) Field of Classification Search
CPC ............... H01L 27/322; H01L 51/5256; H01L 51/5284; H01L 51/56
See application file for complete search history.

(56) References Cited

U.S. PATENT DOCUMENTS 7,547,239 B2    6/2009 Park
2005/0140276 A1    6/2005 Park
(Continued)

FOREIGN PATENT DOCUMENTS

CN    1446032 A    10/2003
CN    1602126 A    3/2005
(Continued)

OTHER PUBLICATIONS

Decision of Rejection for Chinese Patent Application No. 201610402307.3 dated Apr. 13, 2018.
(Continued)

*Primary Examiner* — Phuc Dang
(74) *Attorney, Agent, or Firm* — Calfee, Halter & Griswold LLP

(57) ABSTRACT

The present disclosure relates to an OLED device and a manufacturing method thereof, a display panel and a display device. The OLED device includes: a first electrode disposed on a substrate; an organic light emitting layer disposed on the first electrode; a second electrode disposed on the organic light emitting layer; and a stack of layers disposed (Continued)

on the second electrode. The stack of layers includes at least one inorganic layer and at least one organic layer. The at least one inorganic layer and at least one organic layer are alternately arranged. One organic layer of the at least one organic layer includes a color conversion layer.

14 Claims, 3 Drawing Sheets

(56) References Cited

U.S. PATENT DOCUMENTS

| | | | |
|---|---|---|---|
| 2008/0169758 A1* | 7/2008 | Cok | H01L 51/5262 |
| | | | 313/506 |
| 2009/0021157 A1* | 1/2009 | Kim | H01L 51/5284 |
| | | | 313/504 |
| 2010/0007270 A1 | 1/2010 | Suh | |
| 2010/0207514 A1 | 8/2010 | Tanaka et al. | |
| 2015/0014636 A1* | 1/2015 | Kang | H01L 51/5253 |
| | | | 257/40 |
| 2016/0093828 A1* | 3/2016 | Kim | H01L 51/5253 |
| | | | 257/40 |
| 2017/0141313 A1* | 5/2017 | Min | C23C 14/042 |

FOREIGN PATENT DOCUMENTS

| | | |
|---|---|---|
| CN | 1744784 | 3/2006 |
| CN | 101766059 A | 6/2010 |
| CN | 101960917 A | 1/2011 |
| CN | 101305643 A | 11/2011 |
| CN | 102998734 A | 3/2013 |
| CN | 104752620 A | 7/2015 |
| CN | 105394674 A | 2/2016 |
| CN | 105633117 A | 6/2016 |
| CN | 105932169 A | 9/2016 |
| EP | 2184954 A1 | 5/2010 |
| EP | 2184954 A4 | 9/2010 |
| JP | 2009037801 A | 2/2009 |

OTHER PUBLICATIONS

First Office Action for Chinese Patent Application No. 201610402307.3 dated Apr. 26, 2017.
Second Office Action for Chinese Patent Application No. 201610402307.3 dated Oct. 24, 2017.
Search Report and Written Opinion for International Application No. PCT/CN2017/083045 dated Jul. 27, 2017.
First Office Action from Japanese Patent Application No. 2017-553353 dated Oct. 15, 2018.

* cited by examiner

OLED DEVICE AND MANUFACTURING METHOD THEREOF, DISPLAY PANEL AND DISPLAY DEVICE

CROSS-REFERENCE TO RELATED APPLICATIONS

The present application is based upon International Application No. PCT/CN2017/083045, filed on May 4, 2017, which is based upon and claims the priority of Chinese patent application No. 201610402307.3 filed on Jun. 8, 2016, the disclosure of which is incorporated herein by reference in its entirety.

TECHNICAL FIELD

The present disclosure relates to display technology, and more specifically, to an OLED device and a manufacturing method thereof, a display panel and a display device.

BACKGROUND

With the rise in customer demand for audio and video products, there is a growing requirement for the production of high-resolution, high-quality displays. The Organic Light-Emitting Diodes (OLEDs) are considered to be the star product of the next-generation display due to their characteristics such as self-emission, high brightness, wide viewing angle, fast reaction and manufacturable R, G and B full-color components.

In the current market, the small-to-medium-sized OLEDs have been employed in audio panels and mobile phones as display panels. In the future, the OLED is expected to be further applied to displays of larger sizes such as mobile products, laptops, monitors, wall-hanging TVs and the like. The full-color technology is indispensable and crucial for the OLED.

The large-sized OLED realizes bottom-emitting function usually by means of the combination of thin-film encapsulation technology with the color filter method (WCF) or the color conversion method (CCM). However, the aperture ratio of the large-sized OLED bottom-emitting devices adopting the above-mentioned two methods is obviously insufficient.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide an OLED and a manufacturing method thereof, a display panel and a display device.

The present disclosure aims to provide an OLED device.

In one embodiment of the present disclosure, the provided OLED device includes: a first electrode disposed on a substrate; an organic light emitting layer disposed on the first electrode; a second electrode disposed on the organic light emitting layer; a stack of layers disposed on the second electrode. The stack of layers comprises at least one inorganic layer and at least one organic layer. The at least one inorganic layer and the at least one organic layer are alternately arranged. One organic layer of the at least one organic layer includes a color conversion layer.

The second aspect of the present disclosure provides a display panel including the above OLED device.

The present disclosure also aims to provide a display device.

The third aspect of the present disclosure provides a display device including the above display panel.

The present disclosure also aims to provide a method of manufacturing an OLED device.

The four aspect of the present disclosure provides a method of manufacturing an OLED device including: forming a first electrode on a substrate; forming an organic light emitting layer on the first electrode; forming a second electrode on the organic light emitting layer; forming a stack of layers on the second electrode, wherein the stack of layers includes at least one organic layer and at least one inorganic layer, the at least one organic layer and the at least one inorganic layer are alternately arranged, and the method includes configuring an organic layer of the at least one organic layer to include a color conversion layer.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to further clarify the technical solutions of the embodiments of the present disclosure, the drawings of the embodiments will be briefly described below. It should be understood that the drawings described below relate only to some embodiments of the present disclosure and are not limitative to the present disclosure.

DETAILED DESCRIPTION

Figure 1:
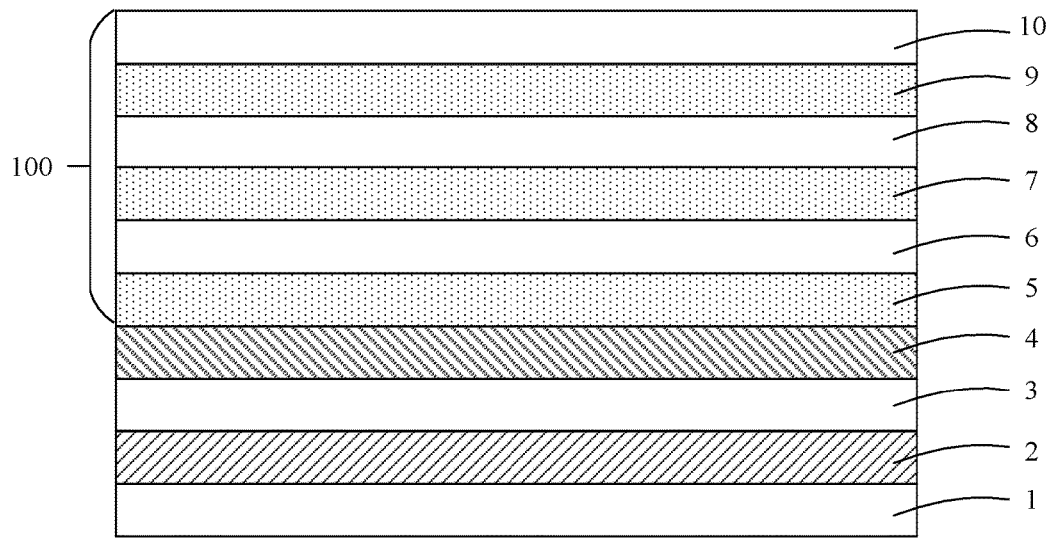
FIG. 1(a) schematically illustrates a configuration of an OLED device according to one embodiment of the present disclosure.
FIG. 1(b) schematically illustrates a configuration of an OLED device according to one embodiment of the present disclosure.
Figure 1:
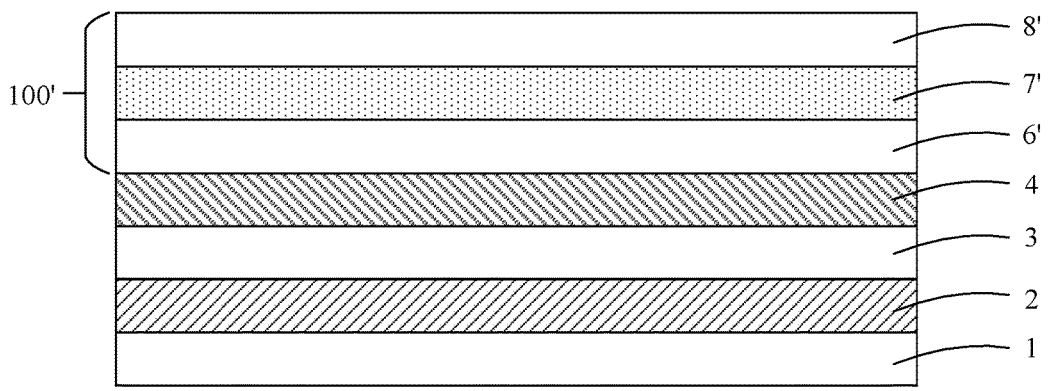

In order to make the purpose, technical solutions and advantages of the embodiments of the present disclosure clearer, the technical solution of the embodiments of the present disclosure will be described clearly and completely below in conjunction with the accompanying drawings. It is obvious that the described embodiments are a part of the embodiments of the present disclosure but not all the embodiment of the present disclosure. Based on the described embodiments of the present disclosure, those skilled in the art can obtain other embodiments, without any inventive work, which should fall within the scope of the invention.

When the elements of the present disclosure and their embodiments are described, the singular form of the word used in the present disclosure the appended claims includes the plural form, and vice versa, unless otherwise explicitly specified in the context. Therefore, when referring to a term with a singular form, the plural form of this term is usually included. The terms "comprise", "include", "contain", "have" are intended to be inclusive and to indicate that there may be additional elements other than the listed elements.

For the purposes of describing surfaces below, as the indicated directions in the drawings, the terms "up", "down", "left", "right", "vertical", "horizontal", "top", "bottom" and their derivative words should concern the present disclosure. The terms "over", "on the top of", "disposed on" or "disposed on the top of" means that a first element such as a first structure is arranged on a second element such as a second structure, wherein a medium element such as an interface structure may exist between the first element and the second element. The term "contact" means a first element such as a first structure and a second element such as a second structure are connected with or without other elements at the interface of the above two elements.

In one embodiment of the present disclosure, the provided OLED device includes: a first electrode disposed on a substrate; an organic light emitting layer disposed on the first electrode; a second electrode disposed on the organic light emitting layer; a stack of layers disposed on the second electrode. The stack of layers includes at least one inorganic layer and at least one organic layer. The at least one inorganic layer and at least one organic layer are alternately arranged. One organic layer of the at least one organic layer includes a color conversion layer. The stack of layers serves as an encapsulation layer.

FIG. 1 schematically illustrates OLED devices according to different embodiments of the present disclosure.

FIG. 1(a) shows a case where the at least one inorganic layer and the at least one organic layer have the same number of layers. As shown in FIG. 1(a), the OLED device includes: a substrate 1; a first electrode 2 disposed on the substrate; an organic light emitting layer 3 disposed on the first electrode; a second electrode 4 disposed on the organic light-emitting layer; and a stack of layers 100 disposed on the second electrode. The stack of layers 100 includes an inorganic layer 5, an organic layer 6, an inorganic layer 7, an organic layer 8, an inorganic layer 9 and an organic layer 10 which are arranged alternately. Any one of the organic layer 6, the organic layer 8 and the organic layer 10 may include a color conversion layer. However, at least one of the organic layer 6, the organic layer 8 and the organic layer 10 are arranged including a color conversion layer. The case where only one organic layer includes a color conversion layer is taken as an example to describe the present invention. It is noted that the case where the stack of layers include three inorganic layers and three organic layers is only taken as an example. The number of the inorganic layers is not limited to three and may be any desired number, and the number of the inorganic layers is not limited to three and may be any desired number.

FIG. 1(b) shows a case where the difference between the number of the at least one inorganic layer and the at least one organic layer is one. As shown in FIG. 1(b), the OLED device includes: a substrate 1; a first electrode 2 disposed on the substrate; an organic light emitting layer 3 disposed on the first electrode; a second electrode 4 disposed on the organic light-emitting layer; and a stack of layers 100' disposed on the second electrode. The stack of layers 100' includes an organic layer 6', an inorganic layer 7', an organic layer 8' which are arranged alternately. Any one of the organic layer 6' and the organic layer 8' may include a color conversion layer. However, both of the organic layer 6' and the organic layer 8' may be configured to include a color conversion layer as required. The case where only one organic layer includes a color conversion layer is taken as an example to describe the present invention. It is noted the case where the stack of layers include one inorganic layer and two organic layers is only taken as an example. The number of the organic layers is not limited to two and may be any desired number, and the number of the inorganic layer is not limited to one and may be any desired number.

It is possible to effectively increase the aperture ratio of the OLED device while making the device thinner, simplifying the process, reducing the manufacturing cost, and making the structure of the obtained device more compact through the following steps: forming a first electrode on a substrate; forming an organic light emitting layer on the first electrode; forming a second electrode on the organic light emitting layer; forming at least one stack of layers on the second electrode, wherein each one of the at least one stack of layers has an inorganic layer(s) and an organic layer(s) which are arranged in order in the direction perpendicular to the upper surface of the substrate, and the organic layer(s) of one stack of layers of the at least one stack of layers is formed as color conversion layer(s).

In the following section, as an example, the case where the number of both the at least one inorganic layer and the at least one organic layer are three is described for illustrative purposes.

Figure 2:
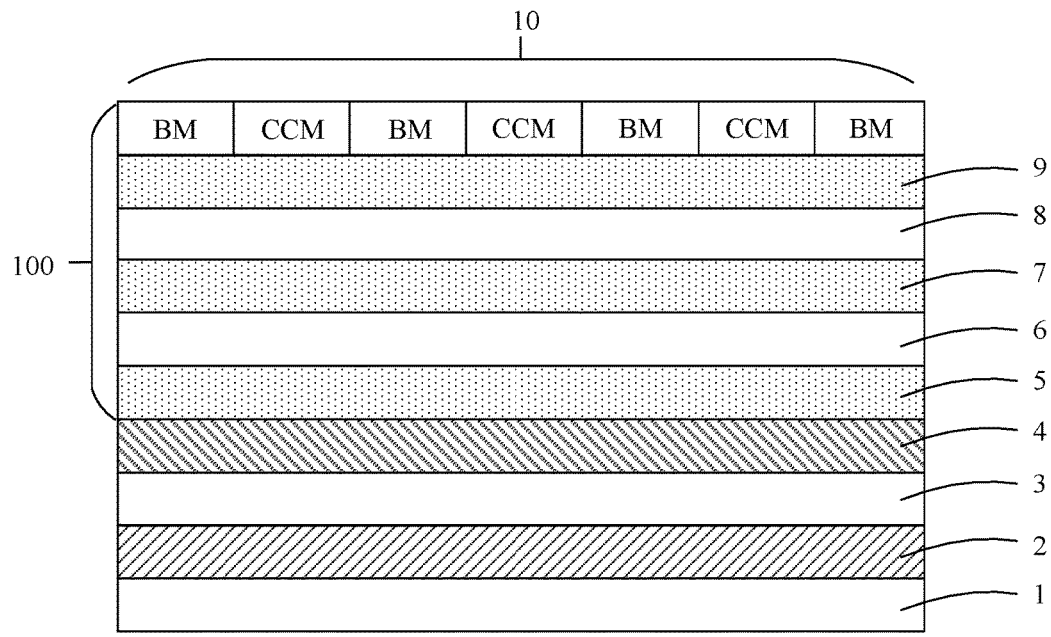
FIG. 2 schematically illustrates a configuration of an OLED device according to one embodiment of the present disclosure.

FIG. 2 schematically illustrates an OLED device according to one embodiment of the present disclosure. FIG. 2 further illustrates more details of FIG. 1(a). In the configuration shown in FIG. 2, the layer that is the most adjacent to the organic light emitting layer in the stack of layers is an inorganic layer. The inorganic layer 5, the inorganic layer 7, and the inorganic layer 9 serve as resist layers to block water vapor and air. The resist layer includes transparent inorganic materials (e.g., oxides, fluorides, nitrides), or any other materials suitable for blocking water and oxygen. The organic layer servers as a flattened layer so as to reduce the stress of the inorganic layer and provide excellent particle-coating effect. The flattened layer includes polymer films or any other materials suitable for forming the flattened layer. The encapsulation performance of the device can be regulated by adjusting the number and the composition of the resist layer and the flattened layer.

The substrate may be a rigid substrate or a flexible substrate, which include any materials suitable for forming a substrate, such as high-molecular polymers, metal foils, ultra-thin glasses and the like. The first electrode and the second electrode include but are not limited to metals, conductive oxygen compounds, conductive organic molecules, conductive polymers, and/or combinations thereof. The color conversion material in the color conversion layer may include organic resins.

In the embodiment shown in FIG. 2, the organic layer 10 includes a color conversion layer. As can be seen from FIG. 2, the color conversion layer includes conversion areas CCM that are provided with color conversion material and a black matrix BM that is provided among the color conversion areas CCM. It is noted that, the numbers of the conversion areas CCM and the black matrix BM are not limited to the numbers shown in the drawings.

Figure 3:
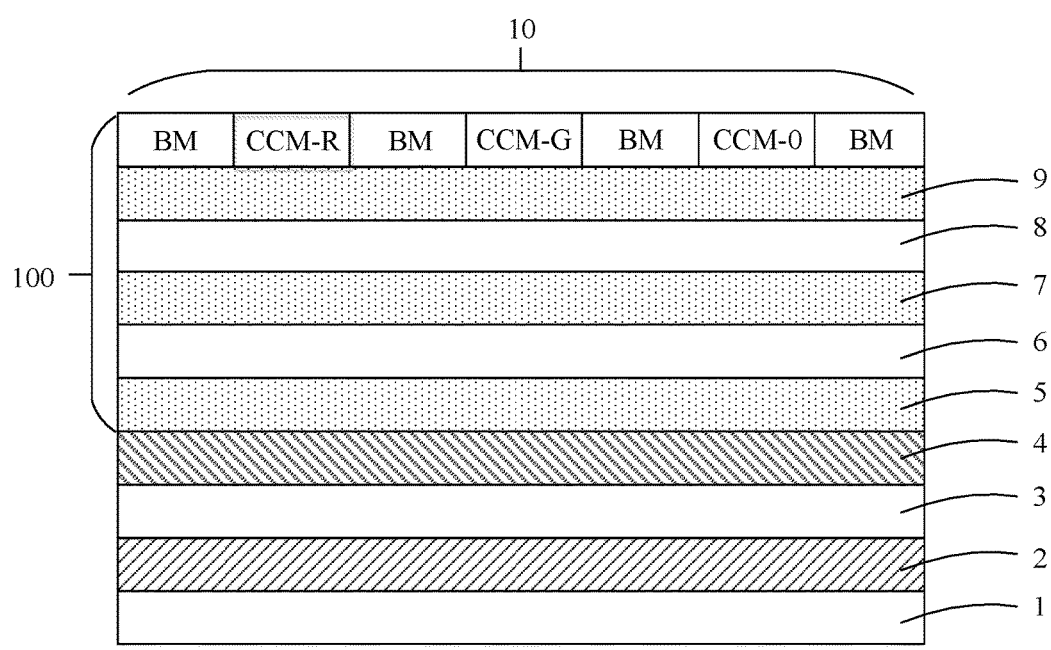
FIG. 3 schematically illustrates a configuration of an OLED device according to one embodiment of the present disclosure.

FIG. 3 further schematically illustrates an OLED device according to one embodiment of the present disclosure. As shown in FIG. 3, the conversion areas CCM include a red conversion area CCM-R, a green conversion area CCM-R and a keeping area CCM-0. The organic light emitting layer 3 include blue light emitting material. The red conversion area CCM-R is configured to convert the incident blue light to red light, the green conversion area CCM-G is configured to convert the incident blue light to green light, and the keeping area is configured to keep the incident blue light being still blue light.

Figure 4:
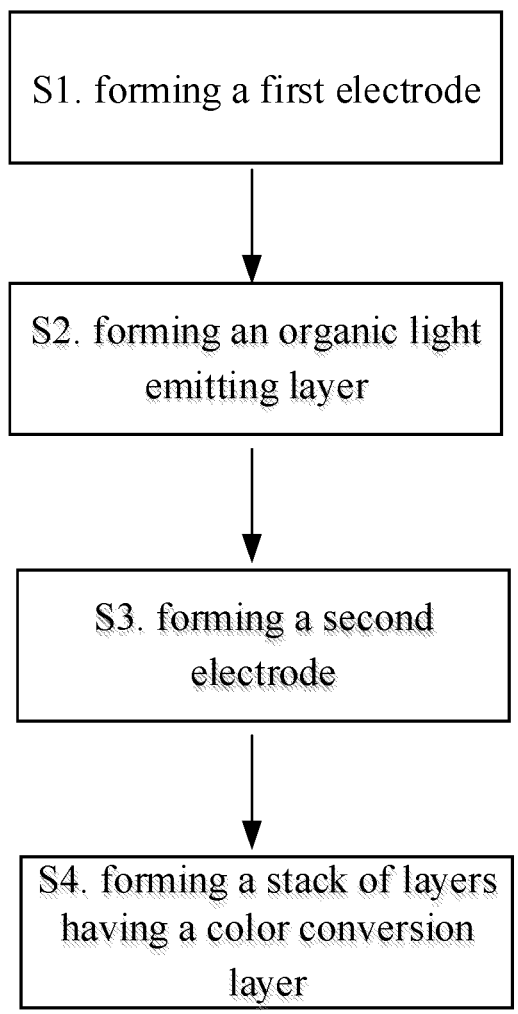
FIG. 4 is a flow chart showing a manufacturing method of an OLED device according to one embodiment of the present disclosure.

FIG. 4 is a flow chart showing a manufacturing method of an OLED device according to one embodiment of the present disclosure. In one embodiment, a method of manufacturing the OLED device includes:

S1. forming a first electrode, i.e., forming a first electrode on a substrate;

S2. forming an organic light emitting layer, i.e., forming an organic light emitting layer on the first electrode;

S3. forming a second electrode, i.e., forming a second electrode on the organic light emitting layer;

S4. forming a stack of layers having a color conversion layer, i.e., forming on the second electrode at least one stack of layers which has at least one organic layer and at least one inorganic layer, wherein the at least one organic layer and the at least one inorganic layer are arranged alternately, and this S4 further includes that one organic layer of the at least one organic layer is configured to include a color conversion layer.

In one embodiment, the inorganic layer serves as a resist layer, the organic layer serves as a flattened layer. This method includes making the at least one inorganic layer and the at least one organic layer have the same number.

In one embodiment, the inorganic layer serves as a resist layer, the organic layer serves as a flattened layer. This method includes making the numbers of the at least one inorganic layer and the at least one organic layer have a difference of one.

The color conversion layer may include conversion areas that are provided with conversion material, and forming the color conversion layer further includes forming a black matrix among the conversion areas.

Forming conversion areas includes forming red conversion areas, green conversion areas and keeping areas which are arranged alternately. The organic light emitting layer includes blue light emitting material. The red conversion area is configured to convert the incident blue light to red light, the green conversion area is configured to convert the incident blue light to green light, and the keeping area is configured to keep the incident blue light being still blue light.

In one embodiment, the layer that is the most adjacent to the organic light emitting layer in the stack of layers is an inorganic layer. The color conversion material may include organic resins.

The display panel of embodiments of the present disclosure includes the above OLED device. The display device of embodiments of the present disclosure includes the above display panel. The display device may be devices having a display function such as display panels, displays, television sets, tablet computers, mobile phones, navigators, etc., which is not limited in the present disclosure.

In the embodiments of the present disclosure, the materials of the conversion area, the keeping area, and the black matrix may have the same organic material as the organic layer, such that they can realize a color conversion function while replacing the organic layer in the conventional encapsulation stack of layers consisting of organic layers and inorganic layers. Therefore, as compared with the conventional bottom emitting device, the top emitting device provided in the embodiments of the present disclosure can improve the aperture ratio. Moreover, since the organic layer including the color conversion layer is adopted to replace the organic layer in the conventional encapsulation stack of layers, the device is thinner, the production process is simplified, the manufacturing cost is reduced, and the structure of the obtained device is made more compact.

It is noted that, "the organic layer of one of the at least one of the stack of layers includes the color conversion layer" recited in the present disclosure is not intended to limit the number of the organic layer having the color conversion layer to one. The solution that two or more organic layers include the color conversion layer also falls within the scope of the present disclosure.

Particular embodiments have been described above. These embodiments are presented by way of example only and are not intended to limit the scope of the present disclosure. In fact, the novel embodiments described herein may be embodied in various other forms. Additionally, various omissions, substitutions and modifications in the form of embodiments described herein may be made without departing from the spirit of the present disclosure. The appended claims and their equivalents are intended to cover such forms or modifications that fall within the scope of the spirit of the present disclosure.

What is claimed is:

1. An OLED device comprising: a first electrode disposed on a substrate; an organic light emitting layer disposed on the first electrode; a second electrode disposed on the organic light emitting layer; a stack of layers disposed on the second electrode, wherein the stack of layers comprises at least one inorganic layer and at least one organic layer, the at least one inorganic layer and the at least one organic layer are alternately arranged, and an organic layer of the at least one organic layer comprises a color conversion layer, wherein the color conversion layer comprises conversion areas that are provided with color conversion material and a black matrix that is provided among the color conversion areas.

2. The OLED device according to claim 1, wherein the at least one inorganic layer serves as a resist layer, the at least one organic layer serves as a flattened layer, and the at least one inorganic layer and the at least one organic layer have the same number of layers.

3. The OLED device according to claim 2, wherein the layer that is the most adjacent to the organic light emitting layer in the stack of layers is an inorganic layer.

4. The OLED device according to claim 1, wherein the at least one inorganic layer serves as a resist layer, the at least one organic layer serves as a flattened layer, and a difference between the number of the at least one inorganic layer and the at least one organic layer is one.

5. The OLED device according to claim 1, wherein the conversion areas comprise red conversion areas, green conversion areas and keeping areas which are arranged alternately, and the organic light emitting layer comprises blue light emitting material, the red conversion area is configured to convert the incident blue light to red light, the green conversion area is configured to convert the incident blue light to green light, and the keeping area is configured to keep the incident blue light being still blue light.

6. The OLED device according to claim 1, wherein the color conversion material comprises organic resin.

7. A display panel comprising the OLED device according to claim 1.

8. A display device comprising the display panel according to claim 7.

9. A method of manufacturing an OLED device comprising: forming a first electrode on a substrate; forming an organic light emitting layer on the first electrode; forming a second electrode on the organic light emitting layer; forming a stack of layers on the second electrode, wherein the stack of layers comprises at least one organic layer and at least one inorganic layer, the at least one organic layer and the at least one inorganic layer are alternately arranged, and the method comprises configuring an organic layer of the at least one organic layer to comprise a color conversion layer, wherein the color conversion layer comprises conversion areas that are provided with conversion material, and the step of forming the color conversion layer further comprises forming a black matrix among the conversion areas.

10. The method according to claim 9, wherein the at least one inorganic layer serves as a resist layer, the at least one organic layer serves as a flattened layer, the method comprises making the at least one inorganic layer and the at least one organic layer have the same number of layers.

11. The method according to claim 10, wherein the layer that is the most adjacent to the organic light emitting layer in the stack of layers is an inorganic layer.

12. The method according to claim 9, wherein the at least one inorganic layer serves as a resist layer, the at least one organic layer serves as a flattened layer, the method comprises making the numbers of the at least one inorganic layer and the at least one organic layer have a difference of one.

13. The method according to claim 9, wherein the step of forming the conversion areas comprises forming red conversion areas, green conversion areas and keeping areas which are arranged alternately, the organic light emitting layer comprises blue light emitting material, the red conversion area is configured to convert the incident blue light to red light, the green conversion area is configured to convert the incident blue light to green light, and the keeping area is configured to keep the incident blue light being still blue light.

14. The method according to claim 9, wherein the color conversion material comprises organic resins.

* * * * *